(12) United States Patent
Jeon et al.

(10) Patent No.: US 12,268,076 B2
(45) Date of Patent: Apr. 1, 2025

(54) DISPLAY APPARATUS HAVING WALLS OF DIFFERENT THICKNESSES

(71) Applicant: Samsung Display Co., Ltd., Yongin-si (KR)

(72) Inventors: Siwan Jeon, Yongin-si (KR); Jangil Kim, Yongin-si (KR); Jeaheon Ahn, Yongin-si (KR); Myoungjong Lee, Yongin-si (KR); Seongyeon Lee, Yongin-si (KR); Seokjoon Hong, Yongin-si (KR)

(73) Assignee: SAMSUNG DISPLAY CO., LTD., Yongin-si (KR)

( * ) Notice: Subject to any disclaimer, the term of this patent is extended or adjusted under 35 U.S.C. 154(b) by 593 days.

(21) Appl. No.: 17/523,785

(22) Filed: Nov. 10, 2021

(65) Prior Publication Data

US 2022/0231087 A1 Jul. 21, 2022

(30) Foreign Application Priority Data

Jan. 19, 2021 (KR) ........................ 10-2021-0007670

(51) Int. Cl.
*H10K 59/38* (2023.01)
*H10K 59/12* (2023.01)
*H10K 71/00* (2023.01)

(52) U.S. Cl.
CPC ............. *H10K 59/38* (2023.02); *H10K 59/12* (2023.02); *H10K 71/00* (2023.02)

(58) Field of Classification Search
CPC ....... H10K 59/12; H10K 59/38; H10K 59/122
See application file for complete search history.

(56) References Cited

U.S. PATENT DOCUMENTS

| | | | |
|---|---|---|---|
| 8,902,140 B2* | 12/2014 | Kawamura | H10K 59/38 345/83 |
| 2011/0038070 A1* | 2/2011 | Nakamata | H10K 59/38 359/891 |
| 2012/0262654 A1 | 10/2012 | Moriwaki | |
| 2018/0197922 A1 | 7/2018 | Song | |
| 2019/0025634 A1* | 1/2019 | Park | G02F 1/133377 |
| 2020/0089047 A1 | 3/2020 | Baek et al. | |
| 2020/0110303 A1 | 4/2020 | Lee et al. | |
| 2020/0212113 A1* | 7/2020 | Song | H10K 50/125 |
| 2020/0321401 A1 | 10/2020 | Ahn et al. | |
| 2021/0202608 A1* | 7/2021 | Lee | H10K 59/123 |
| 2023/0005995 A1* | 1/2023 | Lim | G02B 5/223 |

FOREIGN PATENT DOCUMENTS

| | | |
|---|---|---|
| EP | 3920232 | 12/2021 |
| EP | 3923338 | 12/2021 |
| JP | 2006-072176 | 3/2006 |
| KR | 10-2011-0093985 | 8/2011 |
| KR | 10-2020-0117093 | 10/2020 |

* cited by examiner

*Primary Examiner* — Vu A Vu
*Assistant Examiner* — Jeremy Daniel Watts
(74) *Attorney, Agent, or Firm* — KILE PARK REED & HOUTTEMAN PLLC

(57) ABSTRACT

A display apparatus includes a first substrate; a bank on the first substrate, the bank including first openings, second openings, third openings, and auxiliary openings, wherein a thickness of a partition wall defining the first openings, the second openings, and the third openings is greater than a thickness of an auxiliary partition wall arranged in the auxiliary opening; a first quantum dot layer in the first openings; and a second quantum dot layer in the second openings.

20 Claims, 8 Drawing Sheets

DISPLAY APPARATUS HAVING WALLS OF DIFFERENT THICKNESSES

CROSS-REFERENCE TO RELATED APPLICATION

This application claims priority from and the benefit of Korean Patent Application No. 10-2021-0007670, filed on Jan. 19, 2021, which is hereby incorporated by reference for all purposes as if fully set forth herein.

BACKGROUND

Field

Embodiments of the invention relate generally to a display apparatus, and more particularly, to a display apparatus made from a process that reduces defects from occurring in a manufacturing process thereof.

Discussion of the Background

A display apparatus has a plurality of pixels. For full color display apparatuses, a plurality of pixels may emit light of different colors from each other. To this end, at least some pixels of a display apparatus have a color converter. Therefore, light of a first color generated by a light emitter in some pixels is converted into light of a second color while passing through a corresponding color converter and is extracted to the outside.

However, such a conventional display apparatus has a high possibility that defects will occur in a manufacturing process.

The above information disclosed in this Background section is only for understanding of the background of the inventive concepts, and, therefore, it may contain information that does not constitute prior art.

SUMMARY

One or more embodiments include a display apparatus in which the possibility that defects will occur in a manufacturing process is reduced. However, this is merely an example, and the scope of the disclosure is not limited thereby.

Additional features of the inventive concepts will be set forth in the description which follows, and in part will be apparent from the description, or may be learned by practice of the inventive concepts.

According to one or more embodiments, a display apparatus includes a first substrate, a bank on the first substrate, the bank including first openings, second openings, third openings, and auxiliary openings, wherein a thickness of a partition wall defining the first openings, the second openings, and the third openings is greater than a thickness of an auxiliary partition wall arranged in the auxiliary opening, a first quantum dot layer in the first openings, and a second quantum dot layer in the second openings.

The first quantum dot layer may be configured to convert light having a wavelength belonging to a first wavelength band into light having a wavelength belonging to a second wavelength band, and the second quantum dot layer may be configured to convert light having a wavelength belonging to the first wavelength band into light having a wavelength belonging to a third wavelength band.

The display apparatus may further include a transmissive layer in the third openings and configured to transmit incident light.

The display apparatus may further include a second substrate under the first substrate so that the bank is therebetween, a first pixel electrode, a second pixel electrode, and a third pixel electrode on the second substrate, wherein the first pixel electrode corresponds to the first opening, the second pixel electrode corresponds to the second opening, and the third pixel electrode corresponds to the third opening, and wherein the first pixel electrode, the second pixel electrode, and the third pixel electrode are apart from each other, a pixel defining layer covering edges of each of the first pixel electrode, the second pixel electrode, and the third pixel electrode, and having an opening exposing a central portion of the first pixel electrode, an opening exposing a central portion of the second pixel electrode, and an opening exposing a central portion of the third pixel electrode, an emission layer on the first pixel electrode, the second pixel electrode, and the third pixel electrode and capable of emitting light having a wavelength belonging to a first wavelength band, and an opposite electrode on the emission layer.

Each of the auxiliary openings may be partitioned into a plurality of auxiliary spaces by the auxiliary partition wall.

An area of each of the plurality of auxiliary spaces may be about 33% or less of an area of a closest one among the first opening, the second opening, and the third opening.

When viewed from a direction perpendicular to the first substrate, each of the auxiliary spaces may have a polygonal shape with an obtuse internal angle.

When viewed from a direction perpendicular to the first substrate, each of the auxiliary spaces may have a chamfered shape.

The first openings, the second openings, and the third openings may be on a plurality of imaginary lines, and the auxiliary openings may be between the plurality of imaginary lines.

A combination of the first opening, the second opening, and the third opening may be repeatedly arranged on each of the plurality of imaginary lines.

The combination may be a combination in which the first opening, the second opening, and the third opening are sequentially arranged.

A center of the first opening on a first imaginary line among the plurality of imaginary lines may be arranged to correspond between the second opening and the third opening on a second imaginary line closest to the first imaginary line among the plurality of imaginary lines.

Each of the auxiliary openings may be partitioned into a plurality of auxiliary spaces by the auxiliary partition wall, and in a first direction in which each of the plurality of imaginary lines extends, a length of each of the plurality of auxiliary spaces may be shorter than a length of each of the first opening, the second opening, and the third opening.

Each of the auxiliary openings may be partitioned into a plurality of auxiliary spaces by the auxiliary partition wall, and in a second direction perpendicular to a first direction in which each of the plurality of imaginary lines extends, a length of each of the plurality of auxiliary spaces may be shorter than a length of each of the first opening, the second opening, and the third opening.

When viewed from a direction perpendicular to the first substrate, each of the first openings, the second openings, and the third openings may have a polygonal shape with an obtuse internal angle.

When viewed from a direction perpendicular to the first substrate, each of the first openings, the second openings, and the third openings may have a chamfered shape.

According to one or more embodiments, a method of forming a display apparatus includes forming a first substrate, forming a bank having first openings, second openings, third openings, and auxiliary openings on the first substrate, forming a first quantum dot layer in the first openings, and forming a second quantum dot layer in the second openings. A thickness of a partition wall defining the first openings, the second openings, and the third openings is greater than a thickness of one or more auxiliary partition walls arranged in the auxiliary opening. When a partition wall disposed between one of the first opening and second opening and the auxiliary opening is lost, material from the first opening or second opening flows into the auxiliary opening.

The auxiliary openings include a plurality of auxiliary spaces and the material flows from a first opening or second opening into one of the plurality of auxiliary spaces.

The first openings, second openings, and third openings are disposed along a plurality of parallel imaginary lines and the auxiliary openings are disposed between the plurality of parallel imaginary lines.

Other aspects, features and advantages of the disclosure will become better understood through the accompanying drawings, the claims and the detailed description.

It is to be understood that both the foregoing general description and the following detailed description are illustrative and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate illustrative embodiments of the invention, and together with the description serve to explain the inventive concepts.

DETAILED DESCRIPTION

Figure 1:
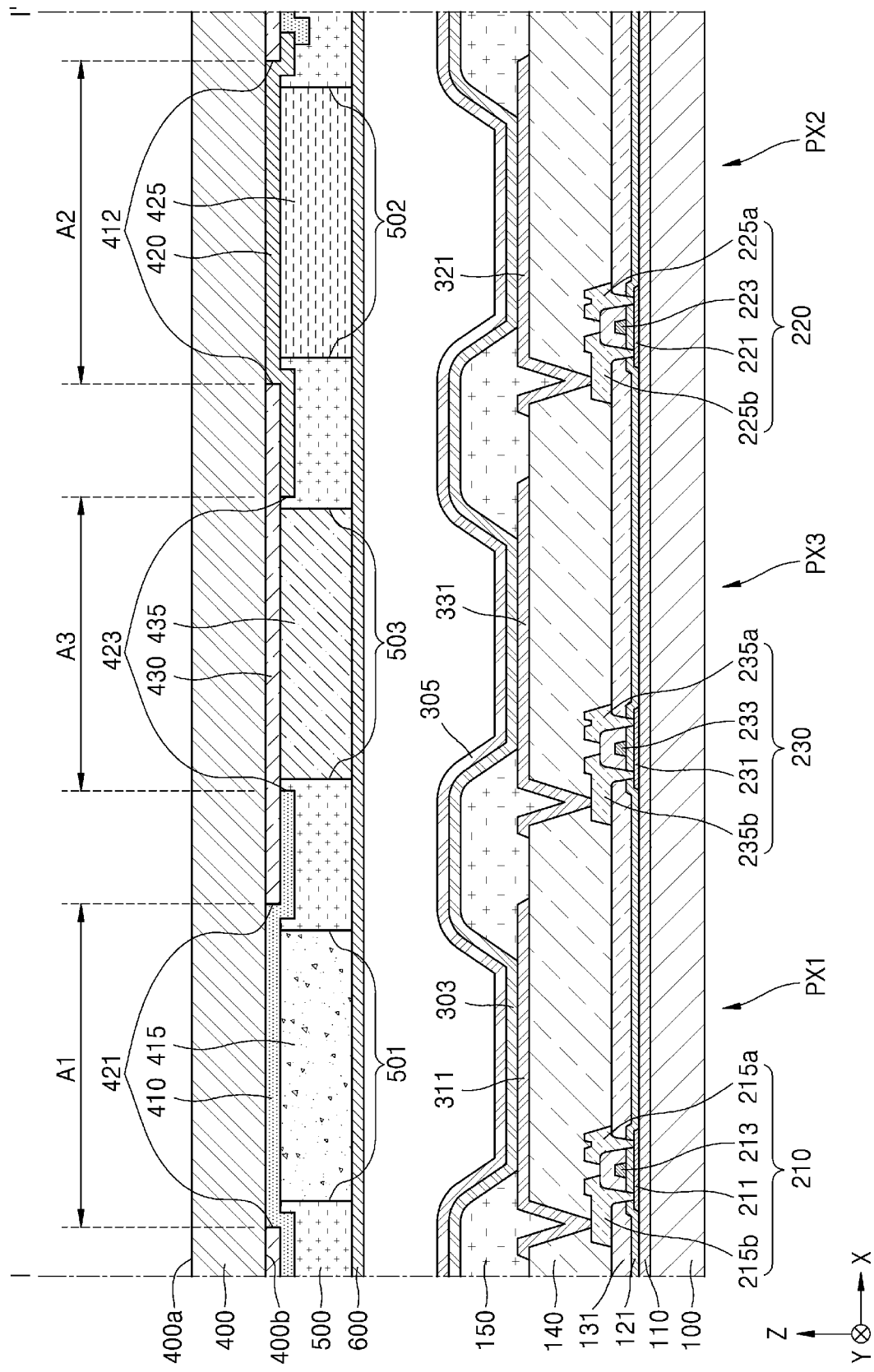
FIG. 1 is a schematic cross-sectional view illustrating a portion of a display apparatus, according to an embodiment.

In the following description, for the purposes of explanation, numerous specific details are set forth to provide a thorough understanding of various embodiments or implementations of the invention. As used herein "embodiments" and "implementations" are interchangeable words that are non-limiting examples of devices or methods employing one or more of the inventive concepts disclosed herein. It is apparent, however, that various embodiments may be practiced without these specific details or with one or more equivalent arrangements. In other instances, well-known structures and devices are illustrated in block diagram form to avoid unnecessarily obscuring various embodiments. Further, various embodiments may be different, but do not have to be exclusive. For example, specific shapes, configurations, and characteristics of an embodiment may be used or implemented in another embodiment without departing from the inventive concepts.

Unless otherwise specified, the illustrated embodiments are to be understood as providing illustrative features of varying detail of some ways in which the inventive concepts may be implemented in practice. Therefore, unless otherwise specified, the features, components, modules, layers, films, panels, regions, and/or aspects, etc. (hereinafter individually or collectively referred to as "elements"), of the various embodiments may be otherwise combined, separated, interchanged, and/or rearranged without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an embodiment may be implemented differently, a specific process order may be performed differently from the described order. For example, two consecutively described processes may be performed substantially at the same time or performed in an order opposite to the described order. Also, like reference numerals denote like elements.

When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

Although the terms "first," "second," etc. may be used herein to describe various types of elements, these elements should not be limited by these terms. These terms are used to distinguish one element from another element. Thus, a first element discussed below could be termed a second element without departing from the teachings of the disclosure.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the term "below" can encompass both an orientation of above and below. Furthermore, the apparatus may be otherwise oriented (e.g., rotated 90 degrees or at other orientations), and, as such, the spatially relative descriptors used herein are interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art.

Various embodiments are described herein with reference to sectional and/or exploded illustrations that are schematic illustrations of idealized embodiments and/or intermediate structures. As such, variations from the shapes of the illustrations as a result, for example, of manufacturing techniques and/or tolerances, are to be expected. Thus, embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Figure 2:
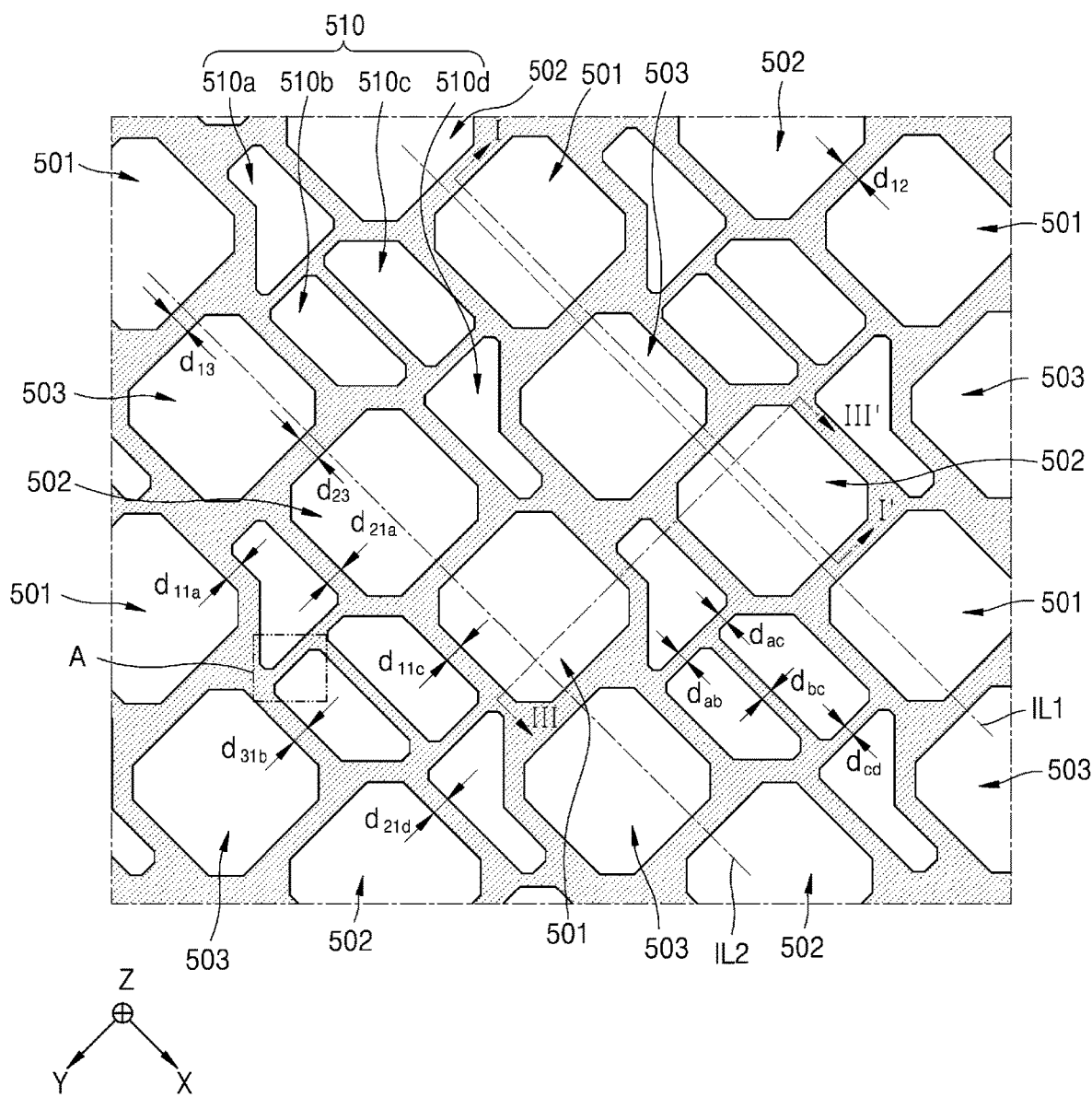
FIG. 2 is a schematic plan view of a portion of the display apparatus of FIG. 1.
Figure 3:
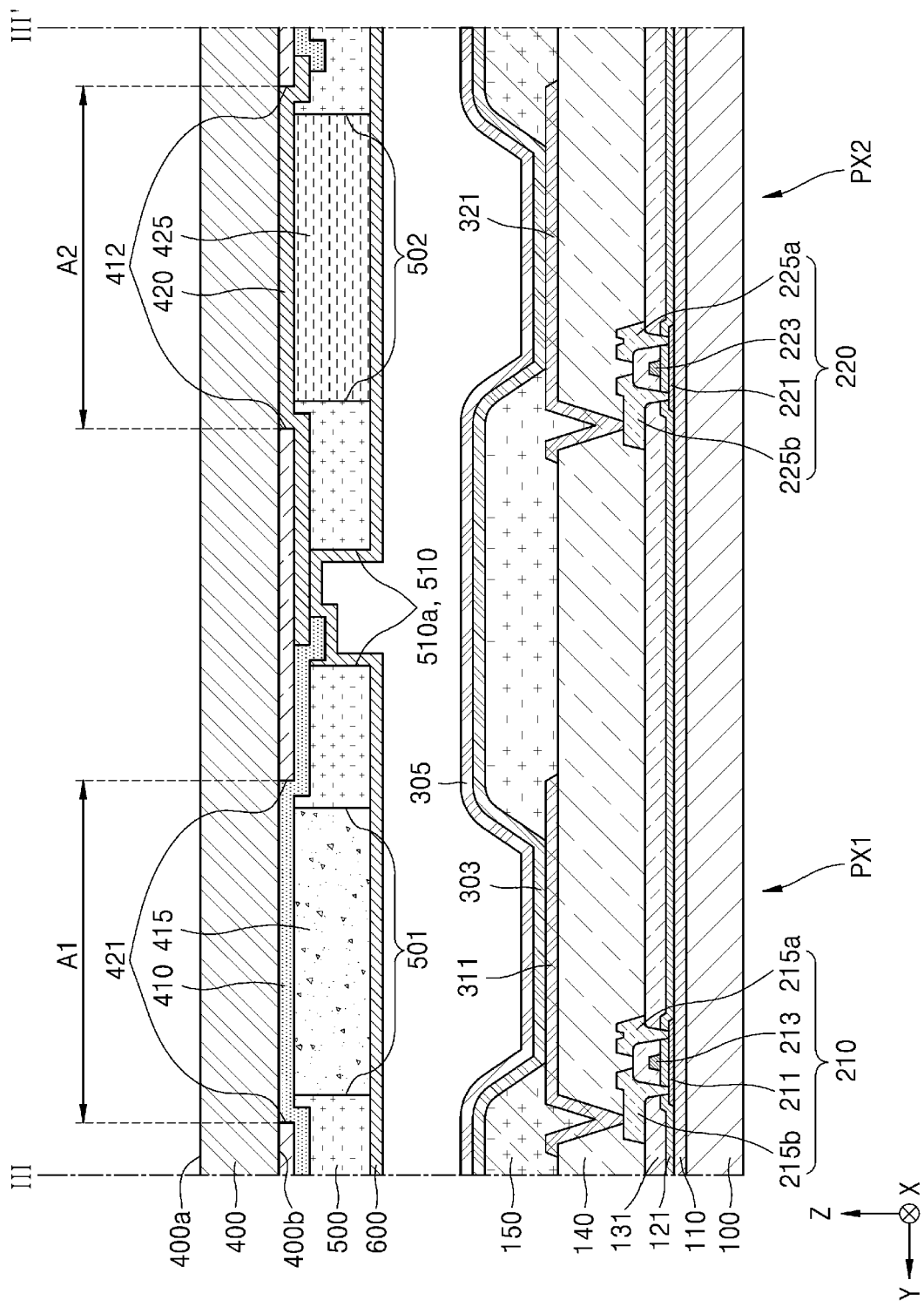
FIG. 3 is a schematic cross-sectional view of the display apparatus taken along line III-III' of FIG. 2.

FIG. 1 is a schematic cross-sectional view illustrating a portion of a display apparatus, according to an embodiment, FIG. 2 is a schematic plan view of a portion of the display apparatus of FIG. 1, and FIG. 3 is a schematic cross-sectional view of the display apparatus taken along line III-III' of FIG. 2. For reference, it may be understood that FIG. 1 is a cross-sectional view of the display apparatus taken along line I-I' of FIG. 2.

The display apparatus according to the present embodiment includes a second substrate 100, which is a lower substrate, a first pixel electrode 311, a second pixel electrode 321, a third pixel electrode 331, and a pixel defining layer 150, which are on the second substrate 100, a first substrate 400, which is an upper substrate, and a bank 500.

The second substrate 100 may include glass, metal, or polymer resin. The second substrate 100 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Of course, the second substrate 100 may be variously modified. For example, the second substrate 100 may have a multilayer structure that includes two layers including the above-described polymer resin and a barrier layer between the two layers and including an inorganic material (silicon oxide, silicon nitride, silicon oxynitride, etc.).

The first pixel electrode 311, the second pixel electrode 321, and the third pixel electrode 331 may be on the second substrate 100. Of course, in addition to the first pixel electrode 311, the second pixel electrode 321, and the third pixel electrode 331, a first thin-film transistor 210, a second thin-film transistor 220, and a third thin-film transistor 230 electrically connected thereto may also be on the second substrate 100. That is, as illustrated in FIG. 1, the first pixel electrode 311 may be electrically connected to the first thin-film transistor 210, the second pixel electrode 321 may be electrically connected to the second thin-film transistor 220, and the third pixel electrode 331 may be electrically connected to the third thin-film transistor 230. The first pixel electrode 311, the second pixel electrode 321, and the third pixel electrode 331 may be on a planarization layer 140 that is on the second substrate 100. The planarization layer 140 will be described later.

The first thin-film transistor 210 may include a first semiconductor layer 211, a first gate electrode 213, a first source electrode 215a, and a first drain electrode 215b. The first semiconductor layer 211 may include amorphous silicon, polycrystalline silicon, an organic semiconductor material, or an oxide semiconductor material. The first gate electrode 213 may include various conductive materials and may have various layered structures. For example, the first gate electrode 213 may include a Mo layer and an Al layer. In this case, the first gate electrode 213 may have a layered structure of Mo/Al/Mo. Alternatively, the first gate electrode 213 may include a $TiN_x$ layer, an Al layer, and/or a Ti layer. The first source electrode 215a and the first drain electrode 215b also may include various conductive materials and may have various layered structures. For example, the first source electrode 215a and the first drain electrode 215b may include a Ti layer, an Al layer, and/or a Cu layer. In this case, the first source electrode 215a and the first drain electrode 215b may have a layered structure of Ti/Al/Ti.

To secure insulation between the first semiconductor layer 211 and the first gate electrode 213, a gate insulating layer 121 including an inorganic material such as silicon oxide, silicon nitride, and/or silicon oxynitride may be between the first semiconductor layer 211 and the first gate electrode 213. Also, an interlayer insulating layer 131 including an inorganic material such as silicon oxide, silicon nitride, and/or silicon oxynitride may be on the first gate electrode 213, and the first source electrode 215a and the first drain electrode 215b may be on the interlayer insulating layer 131. The interlayer insulating layer 131 including the inorganic material may be formed through chemical vapor deposition (CVD) or atomic layer deposition (ALD). The same may apply to the following embodiments and modifications thereof.

A buffer layer 110 including an inorganic material such as silicon oxide, silicon nitride, and/or silicon oxynitride may be between the second substrate 100 and the first thin-film transistor 210 having the above-described structure. The buffer layer 110 may increase the smoothness of the upper surface of the second substrate 100, or may prevent or minimize infiltration of impurities from the second substrate 100 and the like into the first semiconductor layer 211 of the first thin-film transistor 210.

The second thin-film transistor 220 in the second pixel PX2 may include a second semiconductor layer 221, a second gate electrode 223, a second source electrode 225a, and a second drain electrode 225b. The third thin-film transistor 230 in the third pixel PX3 may include a third semiconductor layer 231, a third gate electrode 233, a third source electrode 235a, and a third drain electrode 235b.

Because the structure of the second thin-film transistor 220 and the structure of the third thin-film transistor 230 are identical or similar to the structure of the first thin-film transistor 210 in the first pixel PX1, descriptions thereof are omitted.

Also, the planarization layer 140 may be on the first thin-film transistor 210. For example, as illustrated in FIG. 1, when an organic light-emitting element including the first pixel electrode 311 is on the first thin-film transistor 210, the planarization layer 140 may substantially planarize an upper portion of a protective layer covering the first thin-film transistor 210. The planarization layer 140 may include, for example, an organic material such as acryl, benzocyclobutene (BCB), or hexamethyldisiloxane (HMDSO). Although FIG. 1 illustrates that the planarization layer 140 is a single layer, various modifications may be made thereto. For example, the planarization layer 140 may be multiple layers.

An organic light-emitting element, which includes a first pixel electrode 311, an opposite electrode 305, and an intermediate layer 303 therebetween and including an emission layer, may be in the first pixel PX1. As illustrated in FIG. 1, the first pixel electrode 311 is in contact with one of the first source electrode 215a and the first drain electrode 215b through a contact hole formed in the planarization layer 140 and the like and is electrically connected to the first thin-film transistor 210. The first pixel electrode 311 includes a transmissive conductive layer including a transmissive conductive oxide such as ITO, $In_2O_3$, or IZO, and a reflective layer including a metal such as Al or Ag. For example, the first pixel electrode 311 may have a three-layer structure of ITO/Ag/ITO.

An organic light-emitting element, which includes a second pixel electrode 321, the opposite electrode 305, and the intermediate layer 303 therebetween and including the emission layer, may be in the second pixel PX2. An organic light-emitting element, which includes a third pixel electrode 331, the opposite electrode 305, and the intermediate layer 303 therebetween and including the emission layer, may be in the third pixel PX3. The second pixel electrode 321 is in contact with one of the second source electrode 225a and the second drain electrode 225b through a contact hole formed in the planarization layer 140 and the like and is electrically connected to the second thin-film transistor 220. The third pixel electrode 331 is in contact with one of the third source electrode 235a and the third drain electrode 235b through a contact hole formed in the planarization layer 140 and the like and is electrically connected to the third thin-film transistor 230. The description of the first pixel electrode 311 described above may be applied to the second pixel electrode 321 and the third pixel electrode 331.

As described above, the intermediate layer 303 including the emission layer may be on the second pixel electrode 321 of the second pixel PX2 and the third pixel electrode 331 of the third pixel PX3 as well as the first pixel electrode 311 of the first pixel PX1. The intermediate layer 303 may have an integrated shape over the first pixel electrode 311, the second pixel electrode 321, and the third pixel electrode 331. Of course, when desired, the intermediate layer 303 may be patterned and positioned on the first pixel electrode 311, the second pixel electrode 321, and the third pixel electrode 331. In addition to the emission layer, the intermediate layer 303 may include a hole injection layer, a hole transport layer, and/or an electron transport layer when desired. Some layers included in the intermediate layer 303 may have an integrated shape over the first pixel electrode 311, the second pixel electrode 321, and the third pixel electrode 331, and other layers may be patterned and positioned on the first pixel electrode 311, the second pixel electrode 321, and the third pixel electrode 331.

The opposite electrode 305 on the intermediate layer 303 may also have an integrated shape over the first pixel electrode 311, the second pixel electrode 321, and the third pixel electrode 331. The opposite electrode 305 may include a transmissive conductive layer including ITO, $In_2O_3$, or IZO, and may also include a semi-transmissive layer including a metal such as Al, Li, Mg, Yb, or Ag. For example, the opposite electrode 305 may be a semi-transmissive layer including MgAg, AgYb, Yb/MgAg, or Li/MgAg.

The pixel defining layer 150 may be on the planarization layer 140. The pixel defining layer 150 has openings corresponding to respective pixels. That is, the pixel defining layer 150 covers the edges of each of the first pixel electrode 311, the second pixel electrode 321, and the third pixel electrode 331, and has an opening exposing the central portion of the first pixel electrode 311, an opening exposing the central portion of the second pixel electrode 321, and an opening exposing the central portion of the third pixel electrode 331. As such, the pixel defining layer 150 may define a pixel. Also, as illustrated in FIG. 1, the pixel defining layer 150 may prevent an electric arc or the like from occurring on the edges of the first pixel electrode 311, the second pixel electrode 321, and the third pixel electrode 331 by increasing distances between the opposite electrode 305 and the edges of the first pixel electrode 311, the second pixel electrode 321, and the third pixel electrode 331. The pixel defining layer 150 may include an organic material such as polyimide or hexamethyldisiloxane (HMDSO).

The emission layer included in the intermediate layer 303 may emit light having a wavelength belonging to a first wavelength band. The first wavelength band may be, for example, about 450 nm to about 495 nm.

The first substrate 400 is disposed above the second substrate 100, so that the first pixel electrode 311, the second pixel electrode 321, and the third pixel electrode 331 are between the first substrate 400 and the second substrate 100. The first substrate 400 may include glass or polymer resin. The first substrate 400 may include, for example, a polymer resin such as polyethersulfone, polyacrylate, polyetherimide, polyethylene naphthalate, polyethylene terephthalate, polyphenylene sulfide, polyarylate, polyimide, polycarbonate, or cellulose acetate propionate. Of course, the first substrate 400 may be variously modified. For example, the first substrate 400 may have a multilayer structure that includes two layers including the above-described polymer resin and a barrier layer between the two layers and including an inorganic material (silicon oxide, silicon nitride, silicon oxynitride, etc.). The first substrate 400 may be flexible or bendable.

The bank 500 is disposed on a lower surface 400b of the first substrate 400 in the direction to the second substrate 100 (in-z direction). That is, the bank 500 is disposed between the first substrate 400 and the second substrate 100. The bank 500 includes first openings 501, second openings 502, third openings 503 and auxiliary openings 510. In this case, thicknesses $d_{11a}$, $d_{11e}$, $d_{12}$, $d_{13}$, $d_{21a}$, $d_{21d}$, $d_{23}$, and $d_{31b}$ of partition walls defining the first openings 501, the second openings 502, and the third openings 503 are greater than thickness $d_{ab}$, $d_{ac}$, $d_{bc}$, and $d_{cd}$ of auxiliary partition walls in the auxiliary openings 510. This will be described further later.

The first opening 501 of the bank 500 corresponds to an opening exposing the first pixel electrode 311 of the pixel defining layer 150, the second opening 502 of the bank 500 corresponds to an opening exposing the second pixel electrode 321 of the pixel defining layer 150, and the third opening 503 of the bank 500 corresponds to an opening exposing the third pixel electrode 331 of the pixel defining layer 150. That is, when viewed from a direction (z-axis direction) perpendicular to an upper surface 400a of the first substrate 400 (i.e., in a plan view), the first opening 501 of the bank 500 overlaps the opening exposing the first pixel electrode 311 of the pixel defining layer 150, the second opening 502 of the bank 500 overlaps the opening exposing the second pixel electrode 321 of the pixel defining layer 150, and the third opening 503 of the bank 500 overlaps the opening exposing the third pixel electrode 331 of the pixel defining layer 150. Accordingly, when viewed from the direction (z-axis direction) perpendicular to the upper surface 400a of the first substrate 400 (i.e., in a plan view), a shape of an edge of each of the first to third openings 501 to 503 of the bank 500 may be identical or similar to a shape of an edge of the corresponding opening of the pixel defining layer 150. Accordingly, the first opening 501 of the bank 500 corresponds to the first pixel electrode 311, the second opening 502 of the bank 500 corresponds to the second pixel electrode 321, and the third opening 503 of the bank 500 corresponds to the third pixel electrode 331.

The bank 500 may include various materials. For example, the bank 500 may include an inorganic material such as silicon oxide, silicon nitride, and/or silicon oxynitride. When desired, the bank 500 may include a photoresist material. In this case, the bank 500 may be easily formed through processes such as a light exposure process and a development process.

A first quantum dot layer 415 may be in the first openings 501 of the bank 500. When viewed from the direction (z-axis direction) perpendicular to the upper surface 400a of the first substrate 400 (i.e., in a plan view), the first quantum dot layer 415 may overlap the first pixel electrode 311. The first quantum dot layer 415 may convert light having a wavelength belonging to a first wavelength band into light having a wavelength belonging to a second wavelength band. The second wavelength band may be, for example, about 630 nm to about 780 nm. Of course, the disclosure is not limited thereto, and the wavelength band to which the wavelength to be converted by the first quantum dot layer 415 belongs and the wavelength band to which the wavelength obtained after the conversion belongs may be modified differently.

The first quantum dot layer 415 may have a form in which quantum dots are dispersed in a resin. In the present embodiment, the following embodiments, and the modifications thereof, the quantum dots refer to crystals of semiconductor compounds, and may include any material capable of emitting light of various emission wavelengths according to the size of the crystal. The quantum dots may have a diameter of, for example, about 1 nm to about 10 nm.

The quantum dots may be synthesized by a wet chemical process, a metal organic chemical vapor deposition (MOCVD) process, a molecular beam epitaxy (MBE) process, or similar processes. The wet chemical process is a method of growing quantum dot particle crystals after mixing an organic solvent with a precursor material. In the case of the wet chemical process, when the crystals grow, the organic solvent naturally acts as a dispersant coordinated on the surfaces of the quantum dot crystals and controls the growth of the crystals. Therefore, the wet chemical process is more convenient than vapor deposition method such as MOCVD or MBE. Also, the wet chemical process is a low-cost process and may control the growth of the quantum dot particles.

These quantum dots may include Group III-VI semiconductor compounds, Group II-VI semiconductor compounds, Group III-V semiconductor compounds, Group I-III-VI semiconductor compounds, Group IV-VI semiconductor compounds, Group IV elements or compounds, or any combination thereof.

Examples of the Group III-VI semiconductor compounds may include a binary compound such as GaS, GaSe, $Ga_2Se_3$, GaTe, $In_2S_3$, InS, InSe, $In_2Se_3$, or InTe, a ternary compound such as AgInS, $AgInS_2$, CuInS, $CuInS_2$, $InGaS_3$ or $InGaSe_3$ or any combination thereof.

The Group II-VI semiconductor compounds may include a binary compound such as CdS, CdSe, CdTe, ZnS, ZnSe, ZnTe, ZnO, HgS, HgSe, HgTe, MgSe, or MgS, a ternary compound such as CdSeS, CdSeTe, CdSTe, ZnSeS, ZnSeTe, ZnSTe, HgSeS, HgSeTe, HgSTe, CdZnS, CdZnSe, CdZnTe, CdHgS, CdHgSe, CdHgTe, HgZnS, HgZnSe, HgZnTe, MgZnSe, or MgZnS, a quaternary compound such as CdZnSeS, CdZnSeTe, CdZnSTe, CdHgSeS, CdHgSeTe, CdHgSTe, HgZnSeS, HgZnSeTe, or HgZnSTe, or any combination thereof.

The Group III-V semiconductor compounds may include a binary compound such as GaN, GaP, GaAs, GaSb, AlN, AlP, AlAs, AlSb, InN, InP, InAs, or InSb, a ternary compound such as GaNP, GaNAs, GaNSb, GaPAs, GaPSb, AlNP, AlNAs, AlNSb, AlPAs, AlPSb, InGaP, InNP, InAlP, InNAs, InNSb, InPAs, or InPSb, a quaternary compound such as GaAlNP, GaAlNAs, GaAlNSb, GaAlPAs, GaAlPSb, GaInNP, GaInNAs, GaInNSb, GaInPAs, GaInPSb, InAlNP, InAlNAs, InAlNSb, InAlPAs, or InAlPSb, or any combination thereof. The Group III-V semiconductor compounds may further include Group II elements. Examples of the Group III-V semiconductor compounds further including the Group II elements may include InZnP, InGaZnP, InAlZnP, or the like.

Examples of the Group I-III-VI semiconductor compounds may include a ternary compound such as AgInS, $AgInS_2$, CuInS, $CuInS_2$, $CuGaO_2$, $AgGaO_2$, or $AgAlO_2$, or any combination thereof.

Examples of the Group IV-VI semiconductor compounds may include a binary compound such as SnS, SnSe, SnTe, PbS, PbSe, or PbTe, a ternary compound such as SnSeS, SnSeTe, SnSTe, PbSeS, PbSeTe, PbSTe, SnPbS, SnPbSe, or SnPbTe, and a quaternary compound such as SnPbSSe, SnPbSeTe, or SnPbSTe, and any combination thereof.

Examples of the Group IV elements or compounds may include a single element compound such as Si or Ge, a binary compound such as SiC or SiGe, or any combination thereof.

Each element included in the multi-element compound, such as the binary compound, the ternary compound, and the quaternary compound, may be present in a particle in a uniform concentration or a non-uniform concentration.

The quantum dot may have a single structure or a core-shell double structure in which the concentration of each element included in the corresponding quantum dot is uniform. For example, a material included in the core may be different from a material included in the shell. The shell of the quantum dot may act as a protective layer that maintains semiconductor properties by preventing chemical modification of the core and/or a charging layer that imparts electrophoretic properties to the quantum dot. The shell may be a single layer or multiple layers. An interface between the core and the shell may have a concentration gradient in which the concentration of elements present in the shell decreases toward the center of the core.

Examples of the shell of the quantum dot may include metal or non-metal oxides, semiconductor compounds, or any combination thereof. Examples of the metal or non-metal oxides may include a binary compound such as $SiO_2$, $Al_2O_3$, $TiO_2$, ZnO, MnO, $Mn_2O_3$, $Mn_3O_4$, CuO, FeO, $Fe_2O_3$, $Fe_3O_4$, CoO, $Co_3O_4$, or NiO, a ternary compound such as $MgAl_2O_4$, $CoFe_2O_4$, $NiFe_2O_4$, or $CoMnO_4$, or any combination thereof. As described above, examples of the semiconductor compounds may include Group III-VI semiconductor compounds, Group II-VI semiconductor compounds, Group III-V semiconductor compounds, Group I-III-VI semiconductor compounds, Group IV-VI semiconductor compounds, or any combination thereof. Examples of the semiconductor compounds may include CdS, CdSe, CdTe, ZnS, ZnSe, ZnTe, ZnSeS, ZnTeS, GaAs, GaP, GaSb, HgS, HgSe, HgTe, InAs, InP, InGaP, InSb, AlAs, AlP, AlSb, or any combination thereof.

The quantum dots may have a full width of half maximum (FWHM) of about 45 nm or less, specifically about 40 nm or less, and more specifically about 30 nm or less. In this range, color purity or color reproducibility may be improved. Also, because light is emitted from the quantum dots in all directions, a wide viewing angle may be improved.

Also, the quantum dot may have a form such as a nanoparticles, nanotubes, nanowires, nanofibers, or nanoplatelet particles having a spherical shape, a pyramid shape, a multi-arm shape, or a cubic shape.

Because the energy band gap may be controlled by adjusting the size of the quantum dot, light in various wavelength bands may be obtained from a quantum dot emission layer. Therefore, a light-emitting element that emits light of various wavelengths may be implemented by using quantum dots having different sizes from each other. Specifically, the size of the quantum dot may be selected to emit red light, green light, and/or blue light. Also, the size of the quantum dot may be configured to emit white light by combining light of various colors.

The first quantum dot layer 415 may include a scattering body. Incident light is scattered by the scattering body included in the first quantum dot layer 415, so that the incident light is efficiently converted by the quantum dots in the first quantum dot layer 415. The scattering body is not particularly limited as long as the scattering body is capable of partially scattering transmitted light by forming an optical interface between the scattering body and the transmissive resin. For example, the scattering body may include metal oxide particles or organic particles. Examples of metal oxides for the scattering body may include titanium oxide (TiO2), zirconium oxide (ZrO2), aluminum oxide (Al2O3), indium oxide (In2O3), zinc oxide (ZnO), or tin oxide (SnO2), and examples of organic materials for the scattering body may include an acrylic resin or a urethane resin. The scattering body may scatter light in various directions regardless of the angle of incidence without substantially converting the wavelength of the incident light. Therefore, the scattering body may improve side visibility of the display apparatus. Also, the scattering body included in the first quantum dot layer 415 may increase light conversion efficiency by increasing the probability that light incident on the first quantum dot layer 415 meets (e.g., is incident on or interact with) the quantum dots.

Any resin may be included in the first quantum dot layer 415 as long as the resin has excellent dispersion properties for the scattering body and transmits light. For example, an acrylic resin, an imide-based resin, an epoxy-based resin, and a polymer resin such as benzocyclobutene (BCB) or hexamethyldisiloxane (HMDSO) may be used as the material for forming the first quantum dot layer 415. The material configured to form the first quantum dot layer 415 may be in the first opening 501 of the bank 500 overlapping the first pixel electrode 311 through inkjet printing.

A second quantum dot layer 425 may be in the second openings 502 of the bank 500. When viewed from the direction (z-axis direction) perpendicular to the upper surface 400a of the first substrate 400 (i.e., in a plan view), the second quantum dot layer 425 may overlap the second pixel electrode 321. The second quantum dot layer 425 may convert light having a wavelength belonging to a first wavelength band into light having a wavelength belonging to a third wavelength band. The third wavelength band may be, for example, about 495 nm to about 570 nm. Of course, the disclosure is not limited thereto, and the wavelength band to which the wavelength to be converted by the second quantum dot layer 425 belongs and the wavelength band to which the wavelength obtained after the conversion belongs may be modified differently.

The second quantum dot layer 425 may have a form in which quantum dots are dispersed in a resin. In the present embodiment, the following embodiments, and the modifications thereof, the quantum dots refer to crystals of semiconductor compounds, and may include any material capable of emitting light of various emission wavelengths according to the size of the crystal. The quantum dots may have a diameter of, for example, about 1 nm to about 10 nm. Because the above description of the quantum dots included in the first quantum dot layer 415 may be applied to the quantum dots included in the second quantum dot layer 425, the description of the quantum dots included in the second quantum dot layer 425 is omitted.

The second quantum dot layer 425 may include a scattering body. Incident light is scattered by the scattering body included in the second quantum dot layer 425, so that the incident light is efficiently converted by the quantum dots in the second quantum dot layer 425. The scattering body is not particularly limited as long as the scattering body is capable of partially scattering transmitted light by forming an optical interface between the scattering body and the transmissive resin. For example, the scattering body may include metal oxide particles or organic particles. The metal oxides for the scattering body and the organic materials for the scattering body are the same as described above. The scattering body may scatter light in various directions regardless of the angle of incidence without substantially converting the wavelength of the incident light. Therefore, the scattering body may improve side visibility of the display apparatus. Also, the scattering body included in the second quantum dot layer 425 may increase light conversion efficiency by increasing the probability that incident light incident on the second quantum dot layer 425 will meet the quantum dots.

Any resin may be included in the second quantum dot layer 425 as long as the resin has excellent dispersion properties for the scattering body and transmits light. For example, an acrylic resin, an imide-based resin, an epoxy-based resin, and a polymer resin such as benzocyclobutene (BCB) or hexamethyldisiloxane (HMDSO) may be used as the material configured to form the second quantum dot layer 425. The material configured to form the second quantum dot layer 425 may be in the second opening 502 of the bank 500 overlapping the second pixel electrode 321 through inkjet printing.

In the third pixel PX3, light having a wavelength belonging to the first wavelength band is emitted from the intermediate layer 303 including the emission layer to the outside through the first substrate 400 without wavelength conversion. Therefore, the third pixel PX3 does not have a quantum dot layer. Therefore, a transmissive layer 435 including a transmissive resin may be in the third opening 503 of the bank 500 overlapping the third pixel electrode 331. The transmissive layer 435 may include acryl, benxocyclobutene (BCB), or hexamethyldisiloxane (HMDSO). In addition, the transmissive layer 435 may also include a scattering body. Of course, in some cases, the transmissive layer 435 may not be present in the third opening 503 of the bank 500 unlike that illustrated in FIG. 1.

To protect the first quantum dot layer 415, the second quantum dot layer 425, and the transmissive layer 435, a protective layer 600 may be on the surfaces of the first quantum dot layer 415, the second quantum dot layer 425, and the transmissive layer 435 in the direction to the second substrate 100, as illustrated in FIGS. 1 and 3. The protective layer 600 may include an inorganic material such as silicon oxide or silicon nitride. For example, the protective layer 600 may have a two-layer structure including a silicon oxide layer and a silicon nitride layer. When no material is present in the auxiliary opening 510, the protective layer 600 may cover the inner side and the bottom surface of the auxiliary opening 510, as illustrated in FIG. 3.

As described above, the first quantum dot layer 415 and the second quantum dot layer 425 may be formed by inkjet printing. That is, after the bank 500 having the first opening 501, the second opening 502, and the third opening 503 is formed on the first substrate 400, the first quantum dot layer 415 and the second quantum dot layer 425 may be formed by dotting the material configured to form the first quantum dot layer 415 in the first opening 501 by inkjet printing and by dotting the material configured to form the second quantum dot layer 425 in the second opening 502 by inkjet printing.

At this time, in the process of dotting the material configured to form the first quantum dot layer 415 by inkjet printing, the corresponding material may not be initially positioned in the first opening 501, and in the process of dotting the material configured to form the second quantum dot layer 425, the corresponding material may not be initially positioned in the second opening 502. In this case, as illustrated in FIGS. 2 and 3, the bank 500 in the display apparatus according to the present embodiment is configured to have the auxiliary openings 510 disposed therein in order to reduce a probability that the material configured to form the first quantum dot layer 415 will move into the second opening 502 or the third opening 503 and the possibility that the material configured to form the second quantum dot layer 425 will move into the first opening 501 or the third opening 503.

Therefore, even when the material is not initially positioned in the first opening 501 in the process of dotting the material configured to form the first quantum dot layer 415 by inkjet printing, the probability that the material will move into the second opening 502 or the third opening 503 may be reduced by moving the corresponding material within the auxiliary opening 510. Also, even when the material is not positioned in the second opening 502 in the process of dotting the material configured to form the second quantum dot layer 425 by inkjet printing, the probability that the material will be positioned in the first opening 501 or the third opening 503 may be reduced by moving the corresponding material within the auxiliary opening 510.

Each of the auxiliary openings 510 may be partitioned into a plurality of auxiliary spaces 510*a*, 510*b*, 510*c*, and 510*d* by auxiliary partition walls, as illustrated in FIG. 2.

During the manufacturing process, a portion of the partition wall of the bank 500 may be unintentionally lost. For example, a portion of the partition wall between the first opening 501 and an auxiliary opening 510 among the partition walls defining the first opening 501 may be lost. In this case, the material configured to form the first quantum dot layer 415 dotted in the first opening 501 by inkjet printing may flow out of the first opening 501 and into the auxiliary opening 510 without being positioned in the first opening 501. When the amount of the material configured to form the first quantum dot layer 415 flowing out to the auxiliary opening 510 is excessively large, the first quantum dot layer 415 is not formed to a sufficient thickness in the first opening 501, which causes a pixel to become a defective pixel.

In the case of the display apparatus according to the inventive concepts, each of the auxiliary openings 510 may be partitioned into the auxiliary spaces 510*a*, 510*b*, 510*c*, and 510*d* by the auxiliary partition walls, as illustrated in FIG. 2. Therefore, for example, a portion of the partition wall between the first opening 501 and the auxiliary opening 510 among the partition walls defining the first opening 501 may be lost during manufacturing. When this happens, the material configured to form the first quantum dot layer 415 dotted in the first opening 501 by inkjet printing flows out of the first opening 501 to one or more auxiliary openings 510 without being sufficiently positioned in the first opening 501. Depending on loss of a particular partition wall, material will flow out to an auxiliary space 510*c* or an auxiliary space 510*a*, each having a smaller area than the auxiliary opening 510. Therefore, it is possible to effectively prevent the amount of the material configured to form the first quantum dot layer 415 flowing out to the auxiliary space 510*c* or the auxiliary space 510*a* from increasing excessively.

As illustrated in FIG. 2, a plurality of auxiliary openings 510 that include auxiliary spaces 510*a*, 510*b*, 510*c*, and 510*d* are present in the display apparatus. The auxiliary openings 510 may be disposed in linear formation along the x-axis, and staggered with each other along the y-axis. Different portions of an auxiliary opening 510 may receive material flow from a first opening 501, second opening 502, or third opening 503. For example for a given first opening 501 positioned near a top and center of FIG. 2, auxiliary space 510*c* from one auxiliary opening 510 and auxiliary space 510*a* from another auxiliary opening 510 may receive material flow from the first opening 501 when a partition wall is lost during manufacturing. Also, material may flow from the opening 510 through a lost corner partition wall to an auxiliary space 510*d* on either side thereof.

The same may apply to the other auxiliary openings 510. Even when a portion of the partition wall between the second opening 502 and the auxiliary opening 510 among the partition walls defining the second opening 502 is lost and the material configured to form the second quantum dot layer 425 dotted in the second opening 502 by inkjet printing flows out to the auxiliary opening 510 without being positioned in the second opening 502, the material flows out to the auxiliary space 510*d* or the auxiliary space 510*a*, or to corner auxiliary spaces 510*b* or 510*c*, which have a smaller area than the auxiliary opening 510. Therefore, it is possible to effectively prevent the amount of the material configured to form the second quantum dot layer 425 flowing out to the auxiliary space 510*d*, to corner auxiliary spaces 510*b* or 510*c*, or the auxiliary space 510*a* from increasing excessively.

The transmissive layer 435 is in the third opening 503 as described above. Even when a portion of the partition wall defining the third opening 503 is lost and the material configured to form the transmissive layer 435 dotted by inkjet printing during the manufacturing process flows out of the third opening 503, a very great change may not occur in the amount of light emitted from the third pixel PX3 after manufacturing. However, because the transmissive layer 435 includes a scattering body or the like, it is desirable to minimize the amount of outflow of the material configured to form the transmissive layer 435 as much as possible. In the display apparatus according to the present embodiment, even when a portion of the partition wall between the third opening 503 and the auxiliary opening 510 among the partition walls defining the third opening 503 is lost and the material configured to form the transmissive layer 435 dotted in the third opening 503 by inkjet printing flows out to the auxiliary opening 510 without being fully positioned in the third opening 503, the material flows out to the auxiliary space 510d or the auxiliary space 510b, or to the corner of the auxiliary space 510a, which have a smaller area than the auxiliary opening 510. Therefore, it is possible to effectively prevent the amount of the material configured to form the transmissive layer 435 flowing out to the auxiliary space 510d, the auxiliary space 510a, or the auxiliary space 510b from increasing excessively.

As described above, in dotting the material configured to form the first quantum dot layer 415 or the material configured to form the second quantum dot layer 425 by inkjet printing, when the corresponding material is not positioned in the intended opening, the auxiliary openings 510 may limit the position of the material dotted at an erroneous position. For example, when the material is dotted at a position outside the first opening 501 in the process of dotting the material configured to form the first quantum dot layer 415 by inkjet printing, the auxiliary openings 510 allow the material configured to form the first quantum dot layer 415 to be positioned in one or more auxiliary openings 510, and thus, the probability that the material will be positioned in the second opening 502 or the third opening 503 may be reduced. To this end, when viewed from the direction (z-axis direction) perpendicular to the first substrate 400 (i.e., in a plan view), the auxiliary openings 510 may also secure a sufficient area. In the display apparatus according to the present embodiment, the area of the auxiliary openings 510 may be sufficiently widened by reducing the thicknesses dab, $d_{ac}$, $d_{bc}$, and $d_{cd}$ of the auxiliary partition walls that partition the auxiliary openings 510 into the auxiliary spaces 510a, 510b, 510c, and 510d.

In addition, in the display apparatus according to the present embodiment, the loss of a portion of the partition wall defining the first opening 501, the second opening 502, or the third opening 503 may be prevented by sufficiently increasing the thicknesses $d_{11a}$, $d_{11c}$, $d_{12}$, $d_{13}$, $d_{21a}$, $d_{21d}$, $d_{23}$, and $d_{31b}$ of the partition walls defining the first opening 501, the second opening 502, and the third opening 503. Consequently, the display apparatus according to the present embodiment may achieve such effects by making the thicknesses $d_{11a}$, $d_{11c}$, $d_{12}$, $d_{13}$, $d_{21a}$, $d_{21d}$, $d_{23}$, and $d_{31b}$ of the partition walls defining the first openings 501, the second openings 502, and the third openings 503 greater than the thickness $d_{ab}$, $d_{ac}$, $d_{bc}$, and $d_{cd}$ of the auxiliary partition walls in the auxiliary openings 510. For example, the thicknesses $d_{11a}$, $d_{11c}$, $d_{12}$, $d_{13}$, $d_{21a}$, $d_{21d}$, $d_{23}$, and $d_{31b}$ of the partition walls defining the first openings 501, the second openings 502, and the third openings 503 may be 20 μm, and the thickness $d_{ab}$, $d_{ac}$, $d_{bc}$, and $d_{cd}$ of the auxiliary partition walls in the auxiliary openings 510 may be 14 μm.

As described above, when the amount of the material configured to form the first quantum dot layer 415 flowing out to the auxiliary openings 510 is excessively large, the first quantum dot layer 415 is not formed to a sufficient thickness in the first opening 501, which causes the first pixel PX1 to become a defective pixel. This circumstance also applies to the second quantum dot layer 425 formed in the second opening 502 positioned in the second pixel PX2. Therefore, the area of each of the auxiliary spaces 510a, 510b, 510c, and 510d may be configured to be about 33% or less of the area of the closest opening among the first opening 501, the second opening 502, and the third opening 503.

The number of openings adjacent to any one auxiliary space may be two or more. When the distance from the center of one of the two openings to the center of the auxiliary space is shorter than the distance from the center of the other opening to the center of the auxiliary space, the one opening may be the closest opening of the auxiliary space. When the distance from the center of one of the two openings to the center of the auxiliary space is equal to the distance from the center of the other opening to the center of the auxiliary space, the area of the auxiliary space may be about 33% or less of the smallest area among the areas of the openings.

For reference, the thickness of the first quantum dot layer 415 or the second quantum dot layer 425 (in the z-axis direction) may be 9 μm. When the thickness is reduced by 2.5 μm or more, the pixel emits light having a luminance lower than the intended luminance, resulting in a defective pixel. The area of each of the auxiliary spaces 510a, 510b, 510c, and 510d is about 33% or less of the area of the closest opening among the first opening 501, the second opening 502, and the third opening 503 so as to prevent the thickness of the first quantum dot layer 415 from being reduced by 2.5 μm or more even when a portion of the partition wall defining, for example, the first opening 501 is lost and the thickness of the first quantum dot layer 415 formed in the first opening 501 is reduced.

The first openings 501, the second openings 502, and the third openings 503 of the bank 500 may be on a plurality of imaginary lines, and the auxiliary openings 510 of the bank 500 may be between the imaginary lines. As an example, FIG. 2 illustrates that the first openings 501, the second openings 502, and the third openings 503 are disposed along a first imaginary line IL1 and a second imaginary line IL2 that are parallel to the x-axis but are apart from each other in the y-axis direction, and the auxiliary openings 510 are disposed between the first imaginary line IL1 and the second imaginary line IL2. The auxiliary openings 510 may be arranged successively with a repeated arrangement of auxiliary spaces 510a, 510b, 510c, and 510d. A combination of the first opening 501, the second opening 502, and the third opening 503 may be repeatedly arranged along each of the first imaginary line IL1 and the second imaginary line IL2. FIG. 2 illustrates that a combination in which the first opening 501, the second opening 502, and the third opening 503 are sequentially arranged in the −x direction is repeated along the x-axis.

The center of the first opening 501 on the first imaginary line IL1, which is one of the imaginary lines, may correspond between the second opening 502 and the third opening 503 on the second imaginary line IL2 closest to the first imaginary line IL1 among the imaginary lines. That is, the partition wall between the second opening 502 and the third opening 503 may substantially correspond to the center of the first opening 501. Therefore, the overall structure of the bank 500 may be made more robust.

Also, in the first direction (x-axis direction) in which the imaginary lines extend, a length of each of the auxiliary spaces 510a, 510b, 510c, and 510d may be less than lengths of each of the first openings 501, the second openings 502, and the third openings 503. Alternatively, in the first direction (x-axis direction) in which the imaginary lines extends, the length of each of the auxiliary spaces 510a, 510b, 510c, and 510d may be less than or equal to the length of each of the first opening 501, the second opening 502, and the third opening 503. Also, in the second direction (y-axis direction) perpendicular to the first direction (x-axis direction) in which the imaginary lines extends, the length of each of the auxiliary spaces 510a, 510b, 510c, and 510d may be less than the length of each of the first opening 501, the second opening 502, and the third opening 503. Therefore, because sufficient areas of the first opening 501, the second opening 502, and the third opening 503 are secured, the display apparatus that displays high-quality images with high luminance may be implemented.

Figure 4:
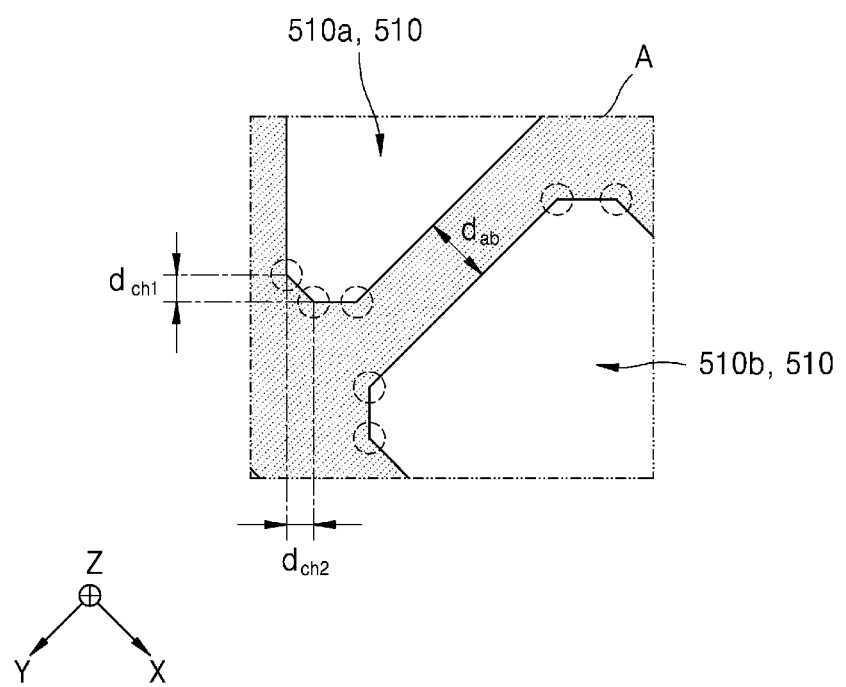
FIG. 4 is an enlarged plan view of region A of FIG. 2.

When viewed from the direction (z-axis direction) perpendicular to the first substrate 400 (i.e., in a plan view) as illustrated in FIG. 2, each of the auxiliary spaces 510a, 510b, 510c, and 510d may have a polygonal shape with an obtuse internal angle. It may be understood that, when viewed from the direction (z-axis direction) perpendicular to the first substrate 400 (i.e., in a plan view), each of the auxiliary spaces 510a, 510b, 510c, and 510d has a chamfered shape. This is illustrated in FIG. 4 that is an enlarged plan view of region A of FIG. 2. In FIG. 4, the chamfered portion is indicated by a dashed circle. For example, the chamfered lengths $d_{ch1}$ and $d_{ch2}$ may be about 5 μm.

In the display apparatus according to the present embodiment, a portion where the partition wall defining the first opening 501, the second opening 502, and the third opening 503 and the auxiliary partition wall positioned in the auxiliary opening 510 meet each other may be sufficiently thick. Also, a portion where the auxiliary partition walls positioned in the auxiliary opening 510 meet each other may be sufficiently thick. Therefore, the structural stability of the partition wall of the bank 500 may be remarkably improved.

The same may apply to the first openings 501, the second openings 502, and the third openings 503. That is, when viewed from the direction (z-axis direction) perpendicular to the first substrate 400 (i.e., in a plan view), each of the first openings 501, the second openings 502, and the third openings 503 may have a polygonal shape with an obtuse internal angle. It may be understood that, when viewed from the direction (z-axis direction) perpendicular to the first substrate 400 (i.e., in a plan view), each of the first openings 501, the second openings 502, and the third openings 503 has a chamfered shape.

As illustrated in FIGS. 1 and 3, color filter layers may be disposed between the lower surface 400b of the first substrate 400 in the direction (−z direction) to the second substrate 100, and the first quantum dot layer 415, the second quantum dot layer 425, and the transmissive layer 435. That is, a first color filter layer 410 may be disposed between the first substrate 400 and the first quantum dot layer 415, a second color filter layer 420 may be disposed between the first substrate 400 and the second quantum dot layer 425, and a third color filter layer 430 may be disposed between the first substrate 400 and the transmissive layer 435. The first color filter layer 410 may transmit only light having a wavelength of about 630 nm to about 780 nm. The second color filter layer 420 may transmit only light having a wavelength of about 450 nm to about 495 nm. The third color filter layer 430 may transmit only light having a wavelength of about 495 nm to about 570 nm.

The first to third color filter layers 410 to 430 may increase the color purity of light emitted to the outside, thereby increasing the quality of displayed images. Also, the first to third color filter layers 410 to 430 may reduce external light reflection by reducing a ratio at which external light incident on the display apparatus is reflected from the first to third pixel electrodes 311 to 331 and then emitted to the outside again. When desired, a black matrix may be disposed between the first to third color filter layers 410 to 430.

As illustrated in FIGS. 1 and 3, the third color filter layer 430 has an opening 421 exposing the first area A1. The opening 421 may define an area corresponding to the first pixel PX1. The first color filter layer 410 fills at least the opening 421. Also, as illustrated in FIG. 1, the third color filter layer 430 has an opening 412 exposing the second area A2. The opening 412 may define an area corresponding to the second pixel PX2. The second color filter layer 420 fills at least the opening 412. The end of the first color filter layer 410 in the direction to the third opening 503 and the end of the second color filter layer 420 in the direction to the third opening 503 define an opening 423 exposing the third area A3. The opening 423 may define an area corresponding to the third pixel PX3.

A portion in which the first color filter layer 410 and the third color filter layer 430 overlap each other, a portion in which the second color filter layer 420 and the third color filter layer 430 overlap each other, and a portion in which the first color filter layer 410 and the second color filter layer 420 overlap each other may serve as a black matrix. For example, when the first color filter layer 410 transmits only light having a wavelength of about 630 nm to about 780 nm and the third color filter layer 430 transmits only light having a wavelength of about 450 nm to about 495 nm, light capable of being transmitted through both the first color filter layer 410 and the third color filter layer 430 does not exist in theory in the portion in which the first color filter layer 410 and the third color filter layer 430 overlap each other.

The filler may fill a gap between the first substrate 400 and the second substrate 100. For example, in the display apparatus illustrated in FIG. 1, a filler may fill a gap between the protective layer 600 and the opposite electrode 305. The filler may include a material capable of transmitting light. For example, the filler may include an acrylic resin or an epoxy-based resin.

Figure 5:
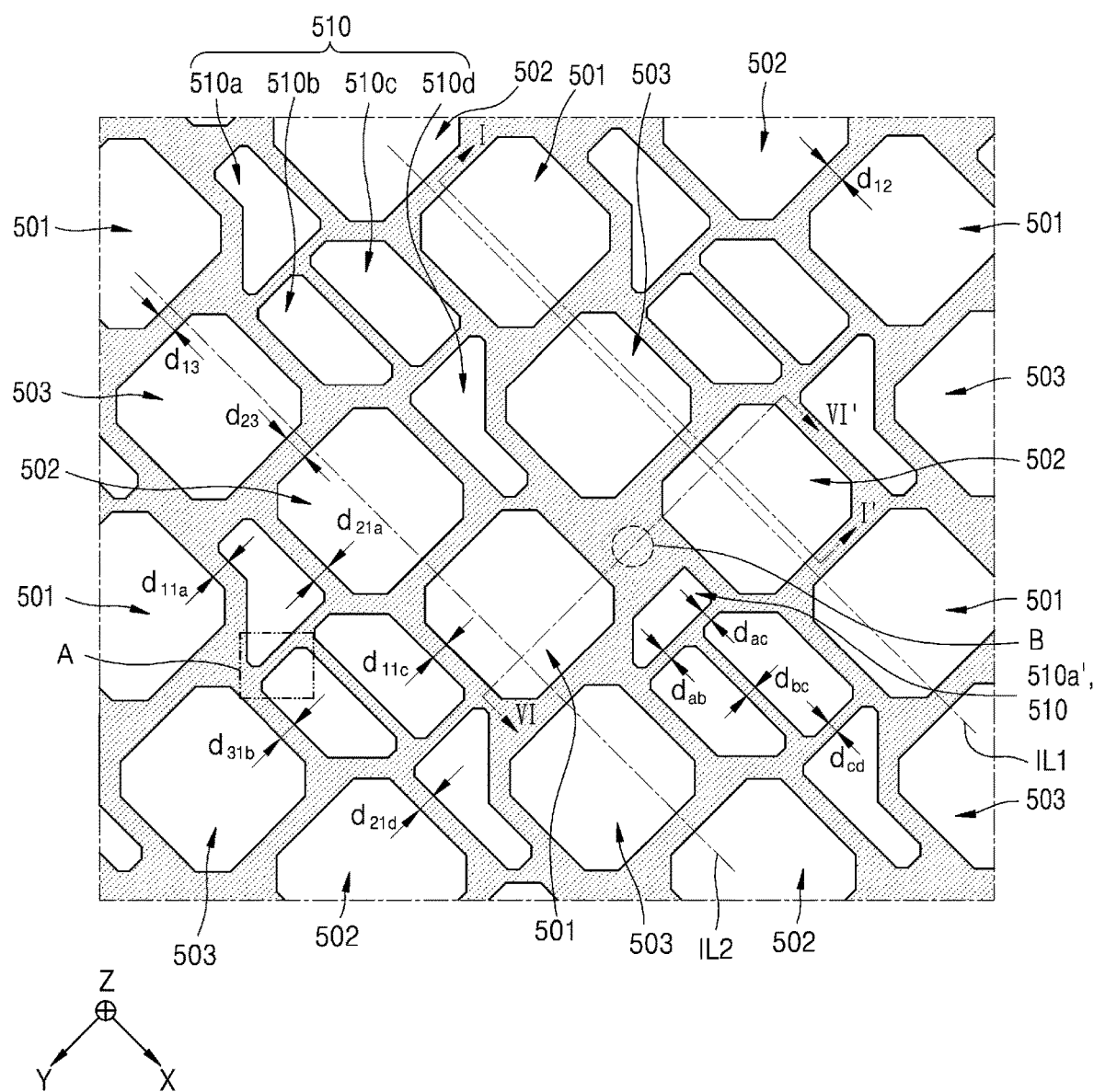
FIG. 5 is a schematic plan view illustrating a portion of a display apparatus, according to another embodiment.
Figure 6:
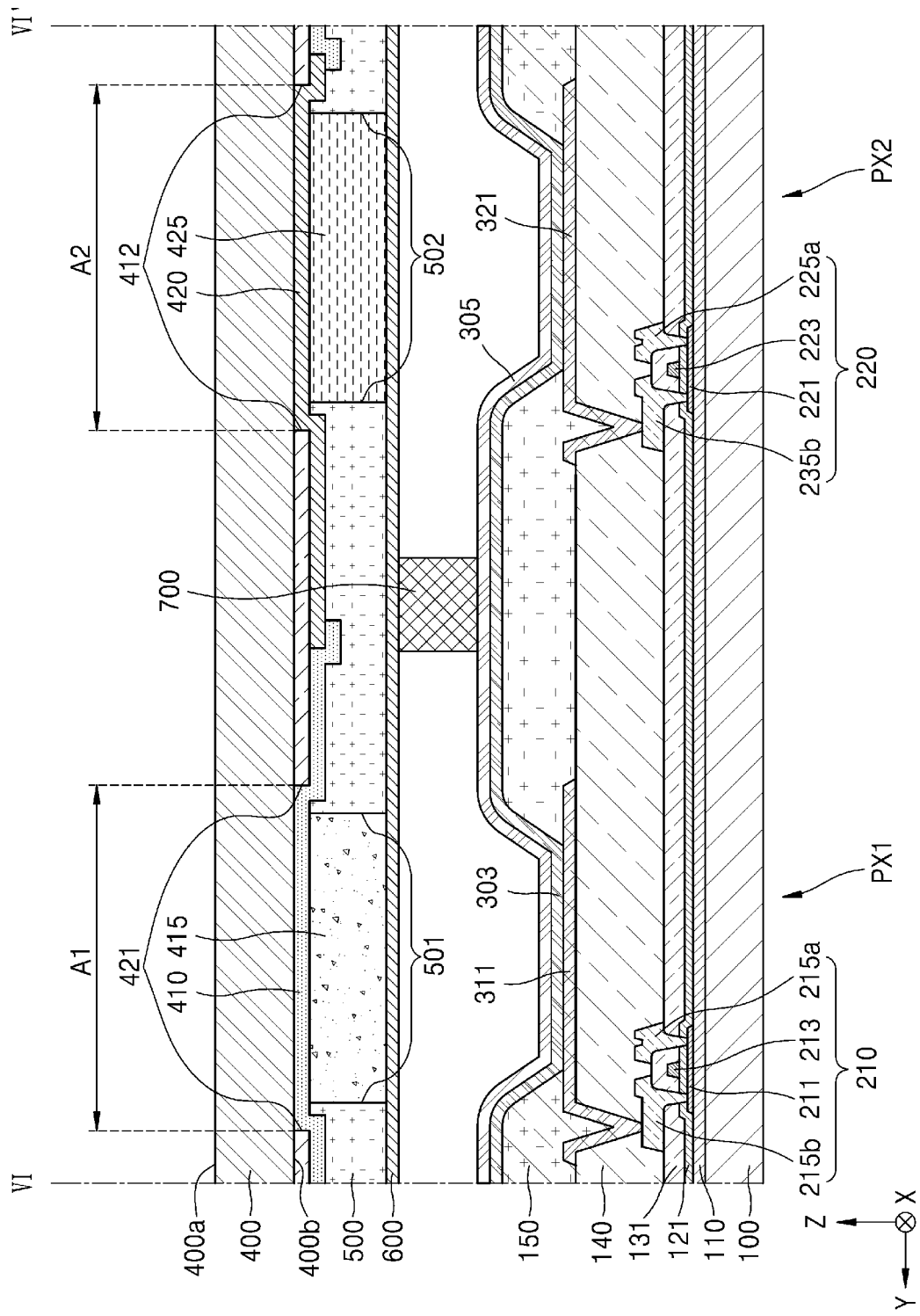
FIG. 6 is a schematic cross-sectional view of the display apparatus taken along line VI-VI' of FIG. 5.

FIG. 5 is a schematic plan view illustrating a portion of a display apparatus, according to another embodiment, and FIG. 6 is a schematic cross-sectional view of the display apparatus taken along line VI-VI' of FIG. 5. As illustrated in FIG. 6, the display apparatus according to the present embodiment has one or more spacers 700 configured to maintain a constant distance between the second substrate 100 and the first substrate 400. To this end, as indicated by B in FIG. 5, the bank 500 may have a space in which the spacer 700 is positioned. Therefore, one auxiliary space 510a' among the auxiliary spaces 510a', 510b, 510c, and 510d of one auxiliary opening 510 may have a smaller area than the corresponding auxiliary space 510a among the auxiliary spaces 510a, 510b, 510c, and 510d of another auxiliary opening 510.

Figure 7:
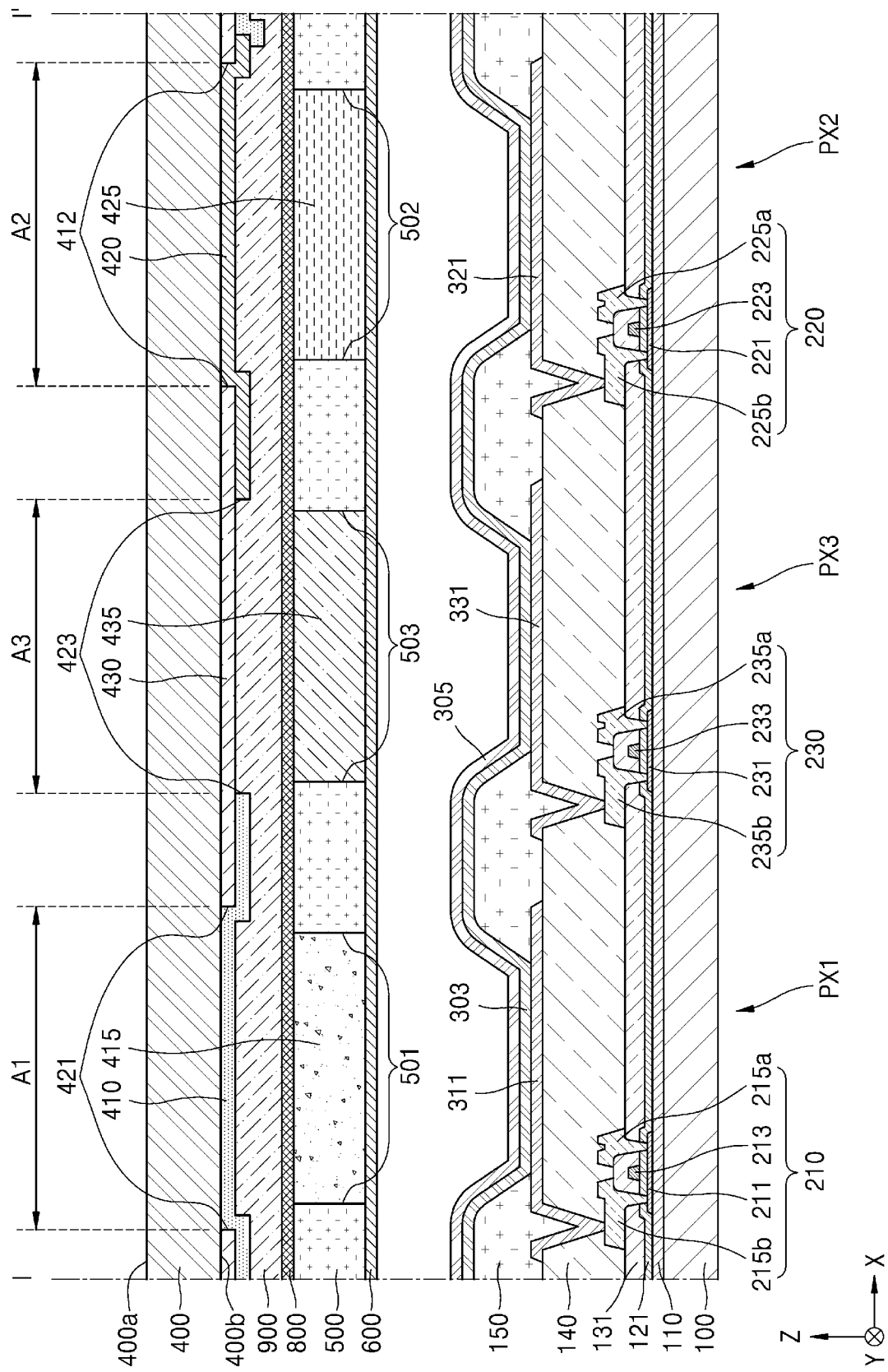
FIG. 7 is a schematic cross-sectional view illustrating a portion of a display apparatus, according to another embodiment.
Figure 8:
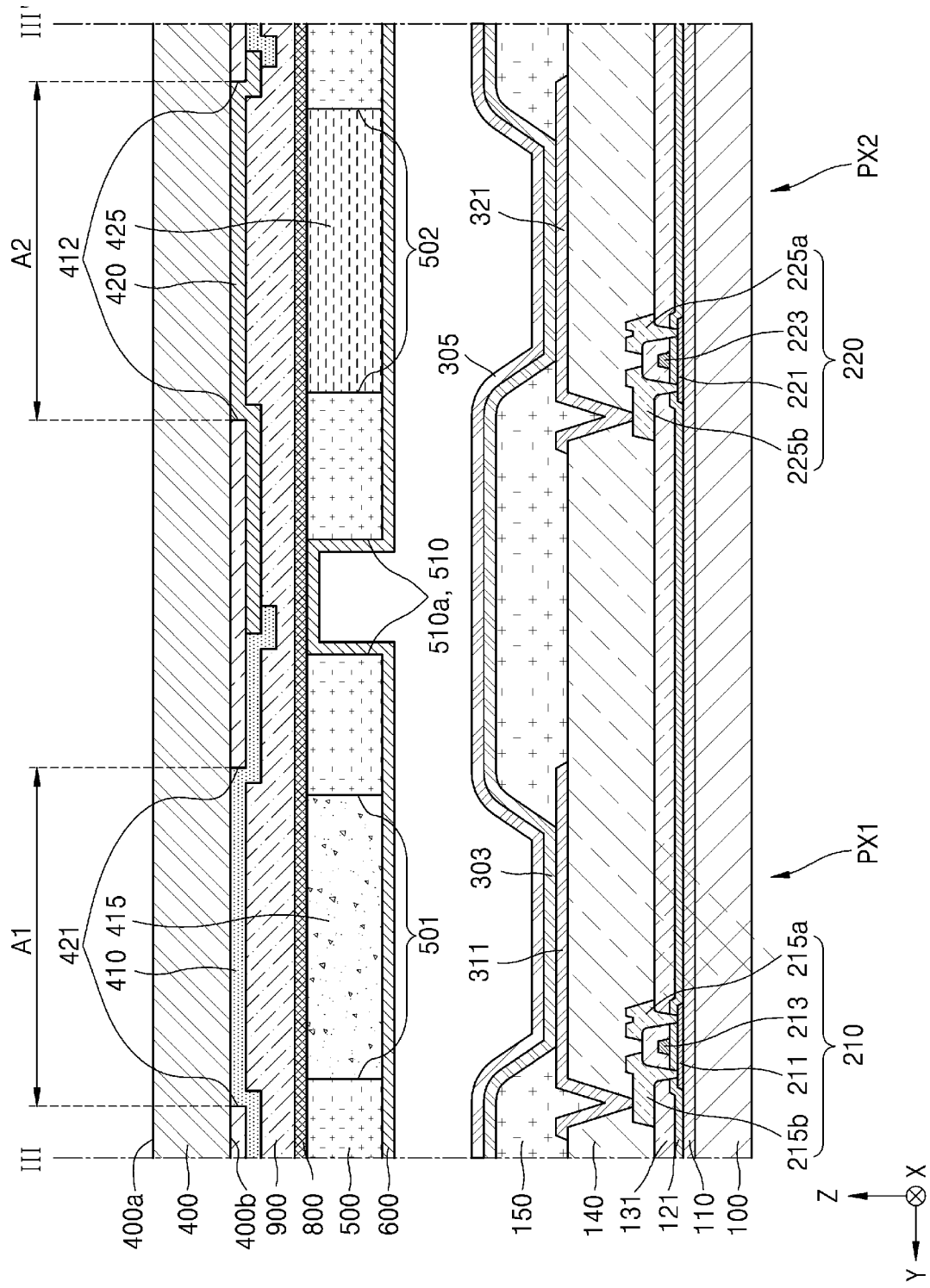
FIG. 8 is a schematic cross-sectional view of a portion of the display apparatus of FIG. 7.

FIG. 7 is a schematic cross-sectional view illustrating a portion of a display apparatus, according to another embodiment, and FIG. 8 is a schematic cross-sectional view of a portion of the display apparatus of FIG. 7. In the display apparatus according to the present embodiment, a low refractive index layer 900 is further provided between a first quantum dot layer 415, a second quantum dot layer 425, a transmissive layer 435, and a bank 500, and a first color filter layer 410, a second color filter layer 420, and a third color filter layer 430. An additional protective layer 800 is further provided between the low refractive index layer 900 and the first quantum dot layer 415, the second quantum dot layer 425, the transmissive layer 435, and the bank 500.

The low refractive index layer 900 may include an organic material having a low refractive index, and may increase extraction efficiency that light having passed through the first quantum dot layer 415 and the second quantum dot layer 425 is extracted to the outside through a first substrate 400. The additional protective layer 800 may include silicon oxide or silicon nitride. The additional protective layer 800 may protect the first quantum dot layer 415 and the second quantum dot layer 425 by preventing infiltration of external impurities into the first quantum dot layer 415 and the second quantum dot layer 425 together with a protective layer 600. When no material is present in the auxiliary opening 510, the protective layer 600 may be in contact with the additional protective layer 800 in the auxiliary opening 510.

According to one or more embodiments, the display apparatus in which the possibility that defects will occur in the manufacturing process is reduced may be implemented. The scope of the disclosure is not limited by such an effect.

Although certain embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display apparatus comprising:
    a first substrate;
    a bank on the first substrate, the bank having first openings, second openings, third openings, and auxiliary openings, wherein
        all of the first openings, second openings, third openings and auxiliary openings pass completely through the bank, and
        a thickness of a first wall defining the first openings, the second openings, and the third openings is greater than a thickness of one or more auxiliary walls arranged in the auxiliary openings;
    a first quantum dot layer in the first openings; and
    a second quantum dot layer in the second openings.

2. The display apparatus of claim 1, wherein the first quantum dot layer is configured to convert light having a wavelength belonging to a first wavelength band into light having a wavelength belonging to a second wavelength band, and the second quantum dot layer is configured to convert light having a wavelength belonging to the first wavelength band into light having a wavelength belonging to a third wavelength band.

3. The display apparatus of claim 1, further comprising:
    a transmissive layer in the third openings and configured to transmit incident light.

4. The display apparatus of claim 1, further comprising:
    a second substrate under the first substrate such that the bank is therebetween;
    a first pixel electrode, a second pixel electrode, and a third pixel electrode on the second substrate, wherein the first pixel electrode corresponds to the first opening, the second pixel electrode corresponds to the second opening, and the third pixel electrode corresponds to the third opening, and wherein the first pixel electrode, the second pixel electrode, and the third pixel electrode are apart from each other;
    a pixel defining layer covering edges of each of the first pixel electrode, the second pixel electrode, and the third pixel electrode, and having an opening exposing a central portion of the first pixel electrode, an opening exposing a central portion of the second pixel electrode, and an opening exposing a central portion of the third pixel electrode;
    an emission layer on the first pixel electrode, the second pixel electrode, and the third pixel electrode and capable of emitting light having a wavelength belonging to a first wavelength band; and
    an opposite electrode on the emission layer.

5. The display apparatus of claim 1, wherein each of the auxiliary openings is partitioned into a plurality of immediately adjacent auxiliary spaces by at least one of the one or more auxiliary walls.

6. The display apparatus of claim 5, wherein an area of each of the plurality of auxiliary spaces is about 33% or less of an area of a closest one among the first opening, the second opening, and the third opening.

7. The display apparatus of claim 5, wherein, when viewed from a direction perpendicular to the first substrate, each of the auxiliary spaces has a polygonal shape with an obtuse internal angle.

8. The display apparatus of claim 5, wherein, when viewed from a direction perpendicular to the first substrate, each of the auxiliary spaces has a chamfered shape.

9. The display apparatus of claim 1, wherein the first openings, the second openings, and the third openings are arranged on a plurality of straight linear paths, and the auxiliary openings are between the plurality of straight linear paths.

10. The display apparatus of claim 9, wherein a combination of the first opening, the second opening, and the third opening is repeatedly arranged on each of the plurality of straight linear paths.

11. The display apparatus of claim 10, wherein the combination is a combination in which the openings are arranged such that the second opening follows the first opening, and the third opening follows the second opening.

12. The display apparatus of claim 11, wherein a center of the first opening on a first straight linear path among the plurality of straight linear paths is disposed between the second opening and the third opening on a second straight linear path closest to the first straight linear path among the plurality of straight linear paths.

13. The display apparatus of claim 9, wherein each of the auxiliary openings is partitioned into a plurality of auxiliary spaces by the auxiliary wall, and,
    in a first direction in which each of the plurality of straight linear paths extends, a length of each of the plurality of auxiliary spaces is shorter than a length of each of the first opening, the second opening, and the third opening.

14. The display apparatus of claim 9, wherein each of the auxiliary openings is partitioned into a plurality of auxiliary spaces by at least one of the one or more auxiliary walls, and
    in a second direction perpendicular to a first direction in which each of the plurality of straight linear paths extends, a length of each of the plurality of auxiliary spaces is shorter than a length of each of the first opening, the second opening, and the third opening.

15. The display apparatus of claim 1, wherein, when viewed from a direction perpendicular to the first substrate, each of the first openings, the second openings, and the third openings has a polygonal shape with an obtuse internal angle.

16. The display apparatus of claim 1, wherein, when viewed from a direction perpendicular to the first substrate, each of the first openings, the second openings, and the third openings has a chamfered shape.

17. The display apparatus of claim 1, wherein when a first wall disposed between one of the first opening or second opening and the auxiliary opening is lost, material from the first opening or second opening flows into an auxiliary opening.

18. A method of forming a display apparatus, comprising:
    forming a first substrate;
    forming a bank on the first substrate, the bank having first openings, second openings, third openings, and auxiliary openings, wherein
    all of the first openings, second openings third openings, and auxiliary openings pass completely through the bank, and
    a thickness of a first wall defining the first openings, the second openings, and the third openings is greater than a thickness of one or more auxiliary walls arranged in the auxiliary openings;
    forming a first quantum dot layer in the first openings; and
    forming a second quantum dot layer in the second openings,
    wherein when a wall disposed between one of the first opening or second opening and the auxiliary opening is lost, material from the first opening or second opening flows into the auxiliary opening.

19. The method of claim 18, wherein the auxiliary openings include a plurality of auxiliary spaces and the material flows from a first opening or second opening into one of the plurality of auxiliary spaces.

20. The method of claim 18, wherein the first openings, second openings, and third openings are disposed along a plurality of parallel lines and the auxiliary openings are disposed between the plurality of parallel lines.

* * * * *